United States Patent
Sywyk et al.

(10) Patent No.: US 6,515,884 B1
(45) Date of Patent: Feb. 4, 2003

(54) CONTENT ADDRESSABLE MEMORY HAVING REDUCED CURRENT CONSUMPTION

(75) Inventors: Stefan P. Sywyk, San Jose, CA (US); Eric H. Voelkel, Ben Lomond, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/026,142

(22) Filed: Dec. 18, 2001

(51) Int. Cl.$^7$ ............................................. G11C 15/00
(52) U.S. Cl. ......................... 365/49; 365/203; 365/204
(58) Field of Search ........................... 365/49, 203, 204, 365/196, 189.07, 104, 191

(56) References Cited

U.S. PATENT DOCUMENTS

| | | | | |
|---|---|---|---|---|
| 5,598,115 A | * | 1/1997 | Holst | 326/113 |
| 5,859,791 A | * | 1/1999 | Schultz et al. | 365/189.05 |
| 5,949,696 A | * | 9/1999 | Threewitt | 365/189.07 |
| 6,181,591 B1 | * | 1/2001 | Miyatake et al. | 365/156 |

* cited by examiner

Primary Examiner—David Nelms
Assistant Examiner—Thong Le
(74) Attorney, Agent, or Firm—Bradley T Sako (57) ABSTRACT

According to one embodiment, a content addressable memory (CAM) can include at least one match line (404), series-coupled transistor pairs comprising match transistors (402-0 to 402-n) and switch devices (422-0 to 422-n), bit match indicator signals (406-0 to 406-n), mask cell value signals (412-0 to 412-n), a match line precharge limiting device (414), a match line precharge control device (416) and an amplifier circuit (432). This configuration can allow for the regulation of the match line (404) discharge path through a discharge control device (410) and a match indication feedback device (426). This, in turn, can allow for match line (404) precharging while at least one of the bit match indicator signals (406-0 to 406-n) is in an intermediate, or approximately half-VDD, level that is consistent with relatively low power precharging of the applied comparands. As such, the pseudo-VSS (408) line control may prevent a static current path from developing during the precharge scenario described above by directly controlling the path between the pseudo-VSS (408) line and the circuit ground supply.

30 Claims, 5 Drawing Sheets

BACKGROUND ART

FIG. 1A

BACKGROUND ART

CONTENT ADDRESSABLE MEMORY HAVING REDUCED CURRENT CONSUMPTION

TECHNICAL FIELD

The present invention relates generally to content addressable memories (CAMs) and more particularly to CAMs having precharge and evaluation cycles.

BACKGROUND OF THE INVENTION

Due to the increasing importance of data networks, including the Internet, the prevalence of content addressable memories (CAMs) has continued to proliferate. CAMs, also referred to as "associative memories," can provide rapid matching functions that are often needed in certain packet processing hardware devices, such as routers and network switches, to name just two. In a typical packet processing operation, a device can receive a packet. The packet can include a "header" that includes various data fields that indicate how the packet should be processed. The device can use a matching function, provided by a CAM, to compare one or more header fields to "look-up" tables stored in the CAMs.

As just one example, a router can use a matching function to match the destination of an incoming packet with a "forwarding" table. The forwarding table can provide "nexthop" information that can allow the incoming packet to be transmitted to its final destination, or to another node on the way to its final destination.

The look-up tables in packet processing devices (which are typically stored in a CAM) are rarely static. That is, the entries with such a table may be constantly updated with different information. This may be particularly true in routers, which can update forwarding tables thousands of times a second.

A typical CAM can store the data values of a look-up table in one or more CAM cell arrays. The CAM cell arrays can be configured into a number of entries, each of which can provide a match indication. In a compare (i.e., match) operation, the data values stored within the entries can be compared to a comparand value (also referred to as a "search key"). In a typical packet processing device, the comparand value can include a field extracted from a data packet header. If a data value matches an applied comparand value, the corresponding entry can generate an active match indication. If a data value does not match an applied comparand value, the corresponding entry can generate an inactive match indication (signifying a "mismatch") condition.

To better understand various aspects of the present invention, a conventional example will now be described.

Figure 1A:
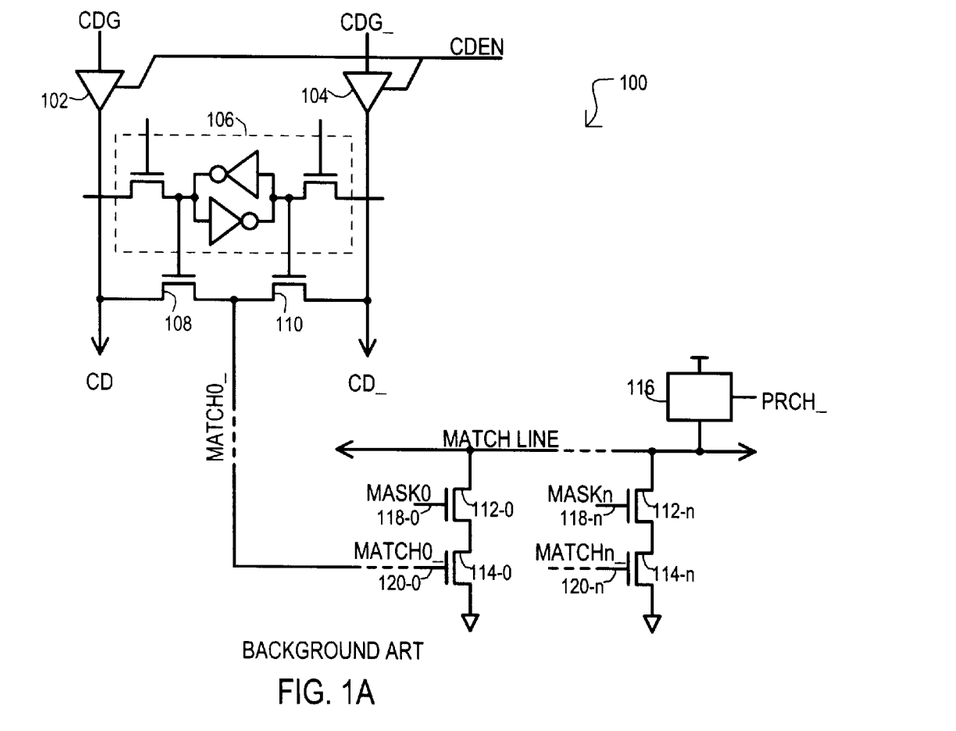
FIG. 1A is a schematic diagram of a prior art match line arrangement.

FIG. 1A is a conventional example that shows the relation between the applied comparand values and the match circuitry and is indicated by the general reference character 100. Comparand drivers 102 and 104 are enabled by a CDEN signal. The illustrated data value cell 106, upon comparison to the applied comparand values, CD and CD__, through NMOS devices 108 and 110, respectively, supplies the bit match indicator signals, such as MATCH0__ 120-0 for the illustrated bit position. All bit match indicator signals 120-0 through 120-n for an entry are coupled to the gates of the corresponding NMOS devices 114-0 through 114-n, A low on a bit match indicator signal conveys a match to the applied comparand and a high indicates a mismatch for the given bit position. Because the preferred embodiment is a full ternary CAM, each bit position can also be individually masked. This is accomplished with the devices 112-0 through 112-n, where the gate of each device can be coupled to the corresponding mask bit signal 118-0 through 118-n. The match detection circuitry also includes precharge control circuitry 116 that pulls the MATCH LINE to a high level during a precharge state.

Figure 1B:
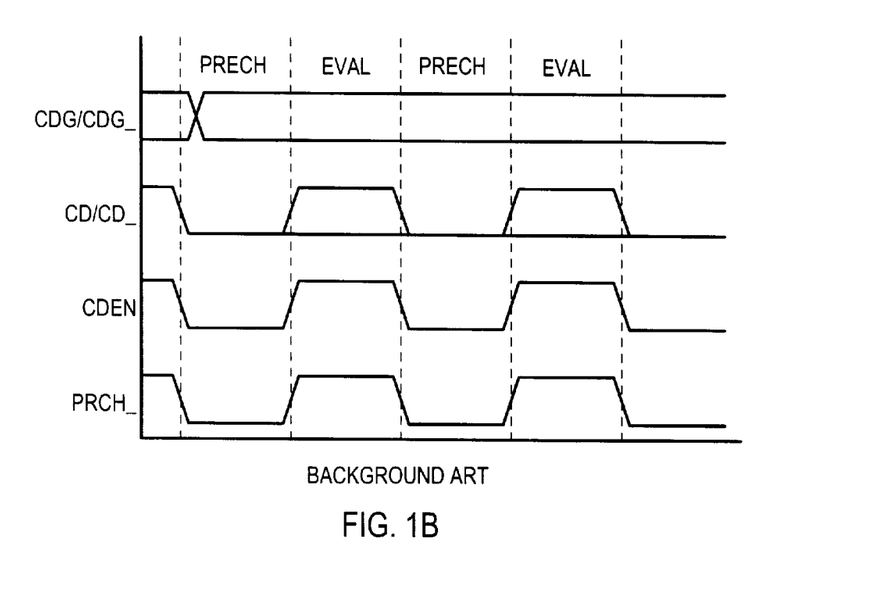
FIG. 1B is a timing diagram corresponding to the circuit of FIG. 1A.

FIG. 1B shows a corresponding timing diagram that illustrates the "PRECH" (precharge) and "EVAL" (evaluation) cycles of the match circuitry. During the precharge phase, the MATCH LINE is pulled to a high-level, but not necessarily to the full VDD level by the precharge circuitry 116 that is enabled by the PRCH__ signal activating low. To facilitate match evaluation, the MATCH0__ to MATCHn__ signals 120-0 through 120-n should be settled to their appropriate levels based on the applied comparand values when the EVAL period begins. In the example illustrated, both CD and CD__ are fully discharged while CDEN is low. The EVAL stage begins when CDEN is charged high and the global comparand values, CDG and CDG__ are allowed to propagate their values to the local comparands, CD and CD respectively. At this point, the MATCH0__ to MATCHn__ signals 120-0 through 120-n can settle to indicate the match status of each bit of the entry.

Focusing on the precharge cycle, one approach is to discharge both CD and CD__ completely to ground while precharging the MATCH LINE to a high level. This high level can be an intermediate level and it does not have to be the full VDD level. The MASK0 to MASKn values 118-0 through 118-n, because they are direct outputs from static storage cells, are at full supply rail levels. In one approach, the MATCH0__ to MATCHn__ lines 120-0 through 120-n can follow the local applied comparand lines to full power rail levels. Commonly-owned, co-pending patent application entitled "Content Addressable Memory Having Compare Data Transition Detector" by Eric Voelkel, filed on Jul. 12, 2001, and incorporated herein by reference shows one approach that can equalize comparand lines, both global and local, to an approximate half-VDD level during precharge. This approach can save power in the comparand line switching. However, if such teachings are used in conjunction with some types of match circuitry, such as that shown in FIG. 1A, during the time period when a MATCH LINE is precharging, comparand lines are equalized close to half-VDD. This situation can cause a current path from VDD to ground through the precharge circuitry 116 of FIG. 1 and at least one of the NMOS discharge stacks, 112-0 and 114-0 through 112-n and 114-n.

It would be desirable to arrive at some way of reducing this current that would result from the overlap of any local comparand line at a level greater than an NMOS threshold voltage, which can occur for a mid-VDD level equalization, and the precharging of the MATCH LINE.

SUMMARY OF THE INVENTION

According to disclosed embodiments, a content addressable memory (CAM) can include a number of match lines, each coupled to the mask cells and the bit match indication signals that comprise each entry of the ternary CAM. The mask cell values correspond to the data values to implement the ternary storage function. The match indication signals result from comparison of the stored data values to the applied comparands. In order to take advantage of power saving techniques employed in the applied comparand precharging scheme described above, corresponding precharge control can be inserted into the match sense amplifier circuitry.

According to one aspect of the embodiments, a binary CAM can include a common node coupled to the match transistors and also to the discharge control device.

According to another aspect of the embodiments, a CAM can include a common node coupled to the series-coupled mask devices and connection devices. This common node can also be coupled to a discharge control device. The discharge control device can be controlled by the precharge control signal. A match line precharge limiting device can also be included.

According to another aspect of the embodiments, a CAM can include a match indication feedback device coupled in series with the discharge control device. The match indication feedback device can be controlled by the match line amplifier circuit output whereby the common node discharge path is cut-off upon detection of a search miss for that entry.

According to another aspect of the embodiments, a CAM can include a combined equalization and precharge indication signal further logically combined with a match line detection signal. The output of the logical combination can control the common node discharge control device.

According to another aspect of the embodiments, a CAM can include a shared common node between a top and a bottom entry. Precharge limiting circuitry for the common node can also be included. Match indication feedback devices can be coupled to the common node discharge control path wherein one match indication feedback device can be coupled to the top entry and the other match indication feedback device can be coupled to the bottom entry. The common node discharge path can then be cut-off if both the top and the bottom entry are detected as search misses.

An advantage of the disclosed embodiments is that static current paths can be avoided by disallowing the discharge of the common node during the precharge portion of a cycle, thereby saving power.

An advantage of the disclosed embodiments is that the match line precharge level is limited to less than a full power rail level, also resulting in power savings.

An advantage of the disclosed embodiments is that the common node precharge is limited and controlled, also resulting in power savings.

An advantage of the disclosed embodiments is that a logical combination of the equalization and the precharge control signal and the match line detection signal can be used to control the common node discharge path, resulting in simpler overall control circuitry.

An advantage of the disclosed embodiments is that two adjacent entries can share a common node, resulting in layout area savings and power savings.

DETAILED DESCRIPTION OF THE EMBODIMENTS

Figure 2:
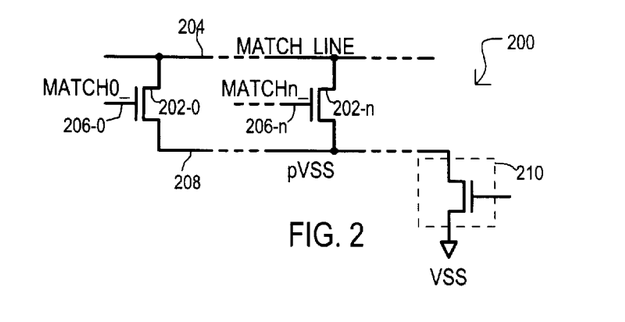
FIG. 2 is a schematic diagram of a first embodiment.

Various embodiments will now be discussed in conjunction with a number of figures. Referring now to FIG. 2, a match line arrangement is designated by the general reference character 200. In FIG. 2, bit match indicator signals 206-0 to 206-n of an entry can be connected to gates of corresponding match transistors 202-0 to 202-n. In a typical binary CAM, there is no mask bit corresponding to each of the entry bits. A drain of each of match transistors 202-0 to 202-n can connect to a common match line 204. A source of each of match transistors 202-0 to 202-n can connect to a common pseudo-VSS (PVSS) node 208. Node 208 can connect to a drain of discharge control device 210. A source of discharge control device 210 can connect to a common ground node VSS.

This configuration can allow for the regulation of the match line 204 discharge path through the discharge control device 210. This, in turn, can allow for a match line 204 to be precharged high while at least one of the bit match indicator signals 206-0 to 206-n is in an intermediate, or approximately half-VDD, level that is consistent with the lower power precharging of the applied comparands. This is in contrast to a conventional approach, such as that shown in FIG. 1A, in which a discharge path is not regulated, and a current path may be created through a precharge circuit and at least one match transistor.

Figure 3A:
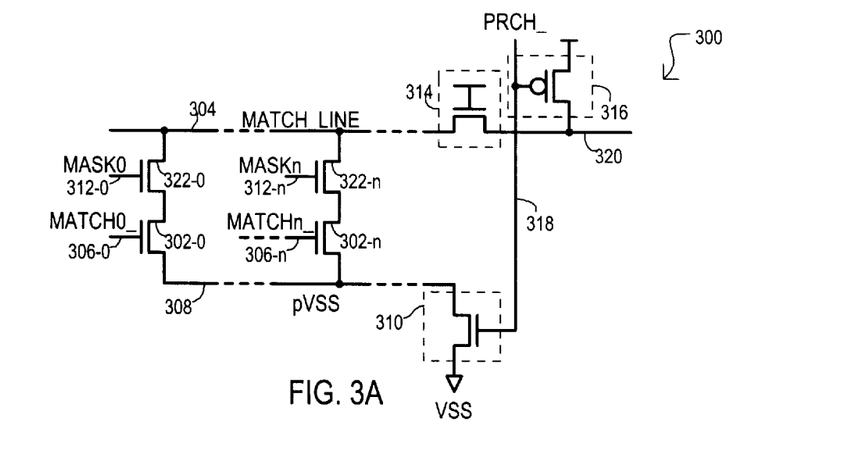
FIG. 3A is a schematic diagram of a second embodiment.

Referring to FIG. 3A, a second embodiment is set forth in a schematic diagram and designated by the general reference character 300. The second embodiment 300 can have many of the same constituents as the first embodiment 200. To that extent, like constituents will be referred to by the same reference character, but with the first character being a 3 instead of a 2. Thus, FIG. 3A includes match transistors 302-0 to 302-n, match line 304, and bit match indicator signals 306-0 to 306-n.

The second embodiment 300 further includes mask cell value signals 312-0 to 312-n, that can each be connected to a gate of a corresponding switch device 322-0 to 322-n. These switch devices 322-0 to 322-n can be connected in series with a corresponding match transistor 302-0 to 302-n to implement a ternary CAM match configuration. The second embodiment 300 may further include a match line precharge limiting device 314, the gate of which can connect to supply VDD in order to limit the maximum match line 304 precharge level to approximately VDD-Vtn (where Vtn can be a threshold voltage of such a device). Also included can be a match line precharge control device 316, the gate of which can connect to the PRCH_ 318 signal and the source of which can connect to the supply VDD. The drain of precharge control device 316 can connect to a node 320.

In a second embodiment 300, the PRCH_ signal 318 can also connect to the gate of discharge control device 310. The general operation can be ascertained when viewed along with the timing diagram of FIG. 3B. During the "PRECH" (precharge) mode of operation, the PRCH_ signal 318 is low and this turns off discharge control device 310 and turns on match line precharge control device 316. This can block any current path from match line 304 to ground and can allow match line 304 to precharge to an approximate level of VDD-Vtn through match line precharge limiting device 314 and precharge control device 316. Also during the precharge mode, the bit match indicator signals 306-0 to 306-n can precharge to an approximate level of half-VDD. Given this, the pseudo-VSS (pVSS) node 308 can precharge to an approximate level of 0.5*VDD-Vtn.

Figure 3B:
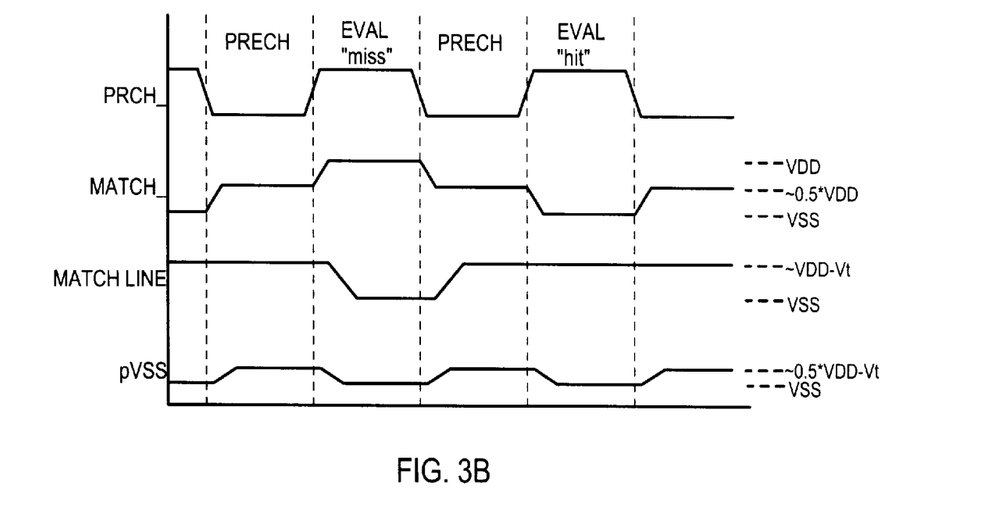
FIG. 3B is a timing diagram corresponding to the second embodiment schematic.

During the "EVAL" (evaluation) mode, the PRCH_ 318 signal is high and this can turn on discharge control device 310 and turn off match line precharge control device 316. The pVSS node 308 can thus be discharged through discharge control device 310 to ground. If there is a search "miss", i.e. at least one of the bits forming the given entry fails to match the corresponding applied comparand bit, the match line 304 will discharge through at least one of the switch devices 322-0 to 322-n connected in series with the corresponding match transistor 302-0 to 302-n. In the second embodiment 300, the match line 304 can fully discharge to the ground level during a search "miss". During the search "hit" case, the match line 304 remains at about its precharge level because none of the switch devices 322-0 to 322-n connected in series with the corresponding match transistor 302-0 to 302-n produces a discharge path. The pVSS node 308, however, can discharge through the discharge control device 310 to ground.

As described, the second embodiment 300 can accommodate a half-VDD precharge level on the applied comparands by utilizing a pseudo-VSS (pVSS) node 308 that is allowed to discharge to ground during "EVAL" (evaluation) modes, but that is not allowed to discharge to ground during "PRECH" (precharge) modes.

Figure 4A:
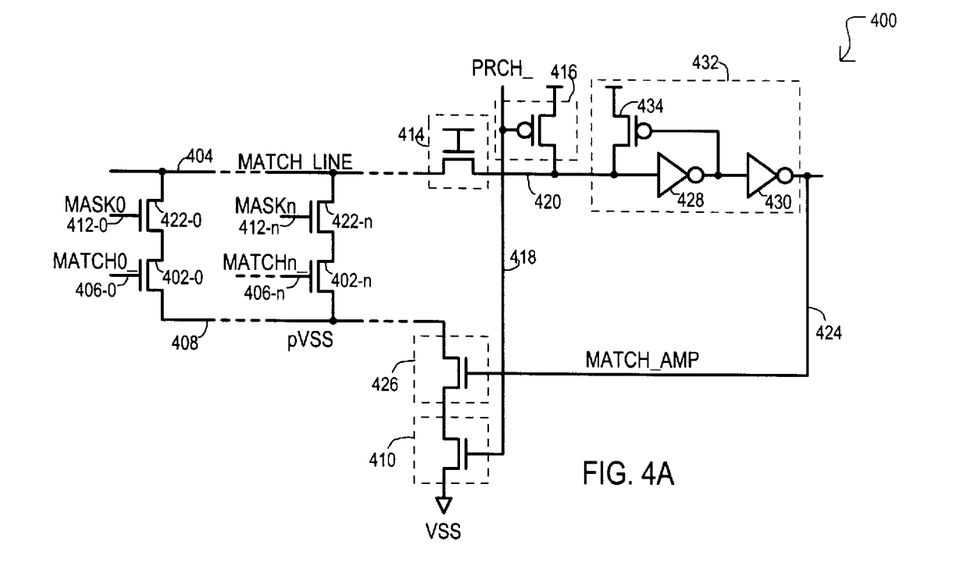
FIG. 4A is a schematic diagram of a third embodiment.

Referring to FIG. 4A, a third embodiment is set forth in a schematic diagram and designated by the general reference character 400. The third embodiment 400 can have many of the same constituents as the second embodiment 300. To that extent, like constituents will be referred to by the same reference character, but with the first character being a 4 instead of a 3. Thus, FIG. 4A includes match transistors 402-0 to 402-n, match line 404, bit match indicator signals 406-0 to 406-n, mask cell value signals 412-0 to 412-n that can be connected to the gate of corresponding switch devices 422-0 to 422-n. Switch devices 422-0 to 422-n can be connected in series with the corresponding match transistor 402-0 to 402-n. A match line precharge limiting device 414 and match line precharge control device 416 may also be included.

A third embodiment 400 can further include a match indication feedback device 426 that can connect in series with discharge control device 410 between pVSS node 408 and ground. Node 420 can connect to the input of amplifier circuit 432, which may include inverters 428 and 430 and pull-up maintenance device 434. The output of inverter 428 can connect to the input of inverter 430 and also to the gate of pull-up maintenance device 434. The drain of pull-up maintenance device 434 can connect to node 420 and its source can connect to the supply VDD. The output of inverter 430, which is also the output of the amplifier circuit 432, can be a match indication signal 424, and can connect to the gate of match indication feedback device 426.

Figure 4B:
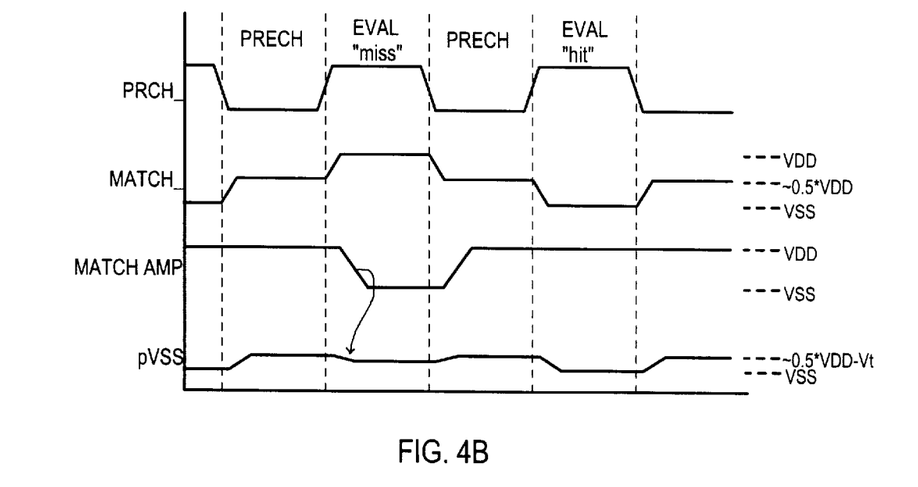
FIG. 4B is a timing diagram corresponding to the third embodiment schematic.

The general operation of the third embodiment 400 can be ascertained when viewed along with the timing diagram of FIG. 4B. The third embodiment 400, as discussed, further includes match indication feedback device 426 that can accept the match indication signal 424 on its gate. This added control discontinues the discharge path through match indication feedback device 426 during the search "miss" evaluation mode. Thus, as soon as the amplifier circuit 432 detects the search "miss" by discharging match indication signal 424, the match indication feedback device 426 can be turned off. This can stop any further discharge of the pVSS node 408 during the remainder of the "EVAL" mode.

As described, the third embodiment 400 allows for further power reduction over the second embodiment 300 by discontinuing further discharge of the pVSS node 408 and, subsequently, the match line 404, once a search "miss" has been detected by the amplifier circuit 432 for that particular entry. Thus, less charge will need to be re-supplied to the pVSS node 408 and to the match line 404 during the subsequent precharge cycle and this translates into overall power savings.

Figure 5A:
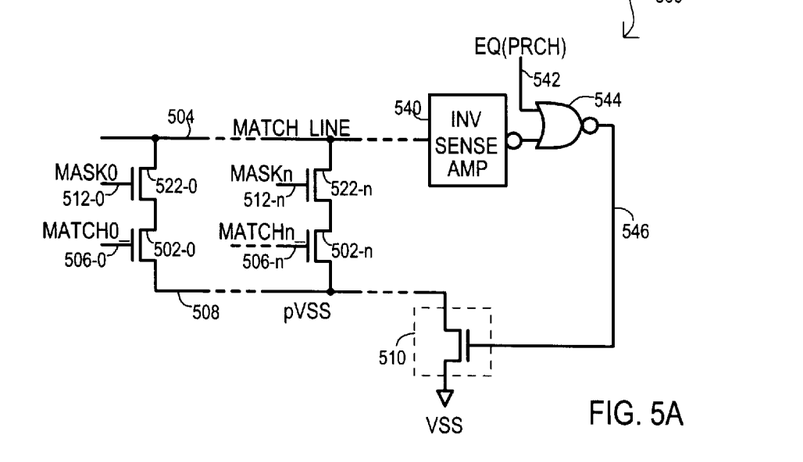
FIG. 5A is a schematic diagram of a fourth embodiment.

Referring to FIG. 5A, a fourth embodiment is set forth in a schematic diagram and designated by the general reference character 500. The fourth embodiment 500 can have many of the same constituents as the third embodiment 400. To that extent, like constituents will be referred to by the same reference character, but with the first character being a 5 instead of a 4. Thus, FIG. 5A includes match transistors 502-0 to 502-n, match line 504, and bit match indicator signals 506-0 to 506-n. The fourth embodiment 500 also includes mask cell value signals 512-0 to 512-n, with each connected to the gate of the corresponding switch device 522-0 to 522-n. These switch devices 522-0 to 522-n can each connect in series with a corresponding match transistor 502-0 to 502-n, to implement a ternary CAM match configuration. The fourth embodiment 500 can also include discharge control device 510 that can connect between the common pVSS node 508 and ground.

A fourth embodiment 500 may further include inverting sense amplifier 540 which can accept match line 504 as an input. An output of inverting sense amplifier 540 can connect to a first input of NOR gate 544. A second input of NOR gate 544 can connect to the EQ(PRCH) signal 542. The output of NOR gate 544, which represents the logical combination of the precharge and the match indication signals, can connect to the gate of discharge control device 510.

Figure 5B:
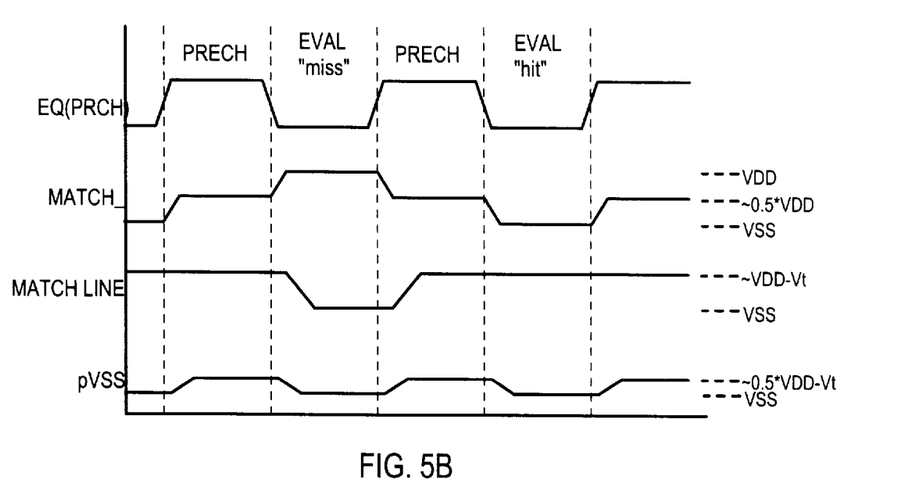
FIG. 5B is a timing diagram corresponding to the fourth embodiment schematic.

The general operation of the fourth embodiment 500 can be ascertained when viewed along with the timing diagram of FIG. 5B. During the "PRECH" (precharge) mode, the EQ(PRCH) signal 542 is high and this turns off discharge control device 510 by bringing node 546 low. Similarly to the operation of the previous embodiments, as described above, this allows for power savings by the equalization of the applied comparands to an approximate half-VDD level. During the "EVAL" (evaluation) mode, the EQ(PRCH) signal 542 can be low, and this can allow for the inverting sense amplifier 540 detection of the match line 504 level to control the discharge control device 510. If there is a search "hit" detection, the inverting sense amplifier 540 outputs a low level and discharge control device 510 turns on. But, in this case, the match line 504 does not discharge. If there is a search "miss" detection, the inverting sense amplifier 540 outputs a high level and discharge control device 510 can be turned off to prevent further discharge of the pVSS line 508 and, subsequently, the match line 504.

As described, the fourth embodiment 500 can allow for power reduction by discontinuing further discharge of the pVSS node 508 and, subsequently, the match line 504, once a search "miss" has been detected by the inverting sense amplifier 540 for that particular entry. Thus, less charge may need to be re-supplied to the pVSS node 508 and to the match line 504 during the subsequent precharge cycle. This can translate into overall power savings. A fourth embodiment 500 is an alternate approach to the third embodiment that logically combines the precharge and the match indication signals for what can be a more simplified and robust circuit design.

Figure 6A:
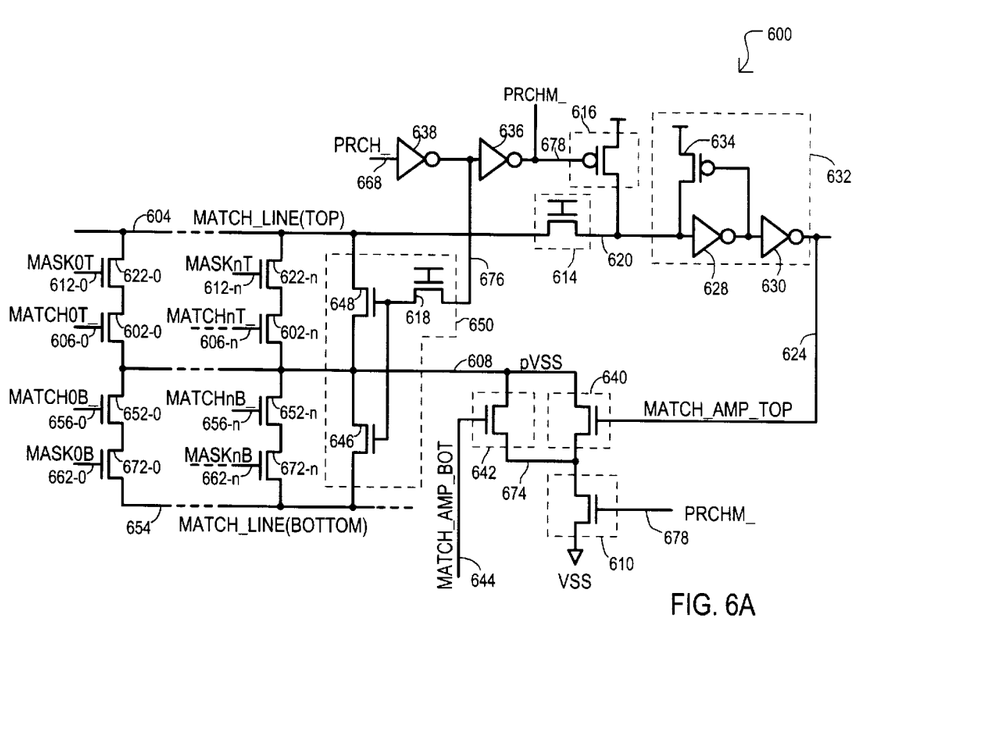
FIG. 6A is a schematic diagram of a fifth embodiment.

Referring to FIG. 6A, a fifth embodiment is set forth in a schematic diagram and designated by the general reference character 600. The fifth embodiment 600 can have many of the same constituents as the third embodiment 400. To that extent, like constituents will be referred to by the same reference character, but with the first character being a 6 instead of a 4. Thus, FIG. 6A includes match transistors (top) 602-0 to 602-n, match line (top) 604, and bit match indicator signals (top) 606-0 to 606-n. The fifth embodiment 600 can also include mask cell value signals (top) 612-0 to 612-n that may each be connected to the gate of a corresponding switch device (top) 622-0 to 622-n. These switch devices (top) 622-0 to 622-n each can connect in series with the corresponding match transistor (top) 602-0 to 602-n to implement a ternary CAM match configuration for the "top" entry. The fifth embodiment 600 can also includes a match line precharge control device (top) 616 and match line precharge limiting device (top) 614. The fifth embodiment 600 also includes amplifier circuit (top) 632, which may be comprised of inverters 628 and 630 and pull-up maintenance device 634.

The fifth embodiment 600 further includes corresponding circuitry for a "bottom" entry. So, the fifth embodiment 600 maps to two different entries, which are referred to as "top" and "bottom". Note that the circuitry for the bottom entry that corresponds to the match line precharge control device (top) 616, the match line precharge limiting device (top) 614, and the amplifier circuit (top) 632 is implied, but not shown, for clarity. The match indication signal for the bottom entry, MATCH_AMP_BOT 644, is the output of the amplifier circuit for the bottom (not shown).

The fifth embodiment 600 can further include match transistors (bottom) 652-0 to 652-n, match line (bottom) 654, and bit match indicator signals (bottom) 656-0 to 656-n. The fifth embodiment 600 can also include mask cell value signals (bottom) 662-0 to 662-n that may each be connected to a gate of a corresponding switch device (bottom) 672-0 to 672-n. These switch devices (bottom) 672-0 to 672-n each can connect in series with the corresponding match transistor (bottom) 652-0 to 652-n to implement a ternary CAM match configuration for the "bottom" entry.

The fifth embodiment 600 further includes a pseudo-VSS (PVSS) line 608 that can be shared between the top and bottom entries. The pVSS line 608 can connect to the drain of match indication feedback device (top) 640 and match indication feedback device (bottom) 642. The gate of match indication feedback device (top) 640 can connect to the match indication signal (top), MATCH_AMP_TOP 624, and its drain can connect to node 674. The gate of match indication feedback device (bottom) 642 can connect to the match indication signal (bottom), MATCH_AMP_BOT 644, and its drain can connect to node 674. The gate of discharge control device 610 can connect to the buffered precharge mode signal indicator version PRCHM_ 678, its drain can connect to node 674, and its source can connect to ground.

The fifth embodiment 600 further includes a pseudo-VSS precharge circuit 650, which includes precharge level limiter device 618 and precharge sharing devices 646 and 648. The source of precharge level limiter device 618 can connect to the gate of each of precharge sharing devices 646 and 648.

The precharge mode indicator signal PRCH_ 668 can connect to the input of inverter 638. The output of inverter 638 can connect to node 676, which also can connect to the drain of precharge level limiter device 618. The gate of precharge level limiter device 618 can connect to the positive supply, VDD. Node 676 can also connect to the input of inverter 636. The output of inverter 636 can provide a buffered precharge mode indicator signal version PRCHM_ 678 to the gate of the match line precharge control device (top) 616 and also to the gate of the corresponding match line precharge control device for the bottom entry (not shown) and the gate of the discharge control device for the bottom entry (not shown) and the gate of the discharge control device for the bottom entry (not shown).

Figure 6B:
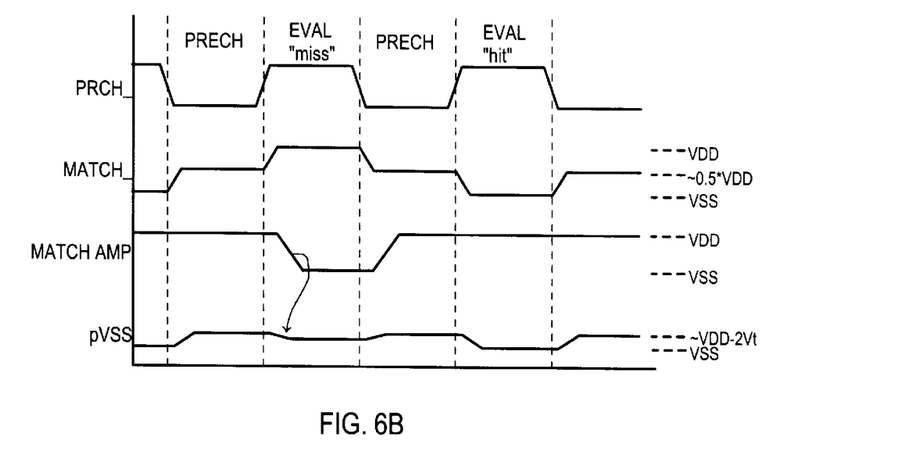
FIG. 6B is a timing diagram corresponding to the fifth embodiment schematic.

The general operation of the fifth embodiment 600 can be ascertained when viewed along with the timing diagram of FIG. 6B. During the "PRECH" (precharge) mode, the PRCH_ signal 668 is low and this charges node 676 high through inverter 638. The gates of precharge sharing devices 646 and 648 can be charged up to approximately VDD-Vtn through precharge level limiter device 618. As discussed above, match line (top) 604 and also match line (bottom) 654 can each charge to approximately VDD-Vtn. Thus, the common pVSS line 608 can charge to approximately VDD-2Vtn.

Also during the precharge mode, node 620 can be charged to the full VDD level by precharge control device (top) 616. Given this, amplifier circuit (top) 632 can generate a high level on MATCH_AMP_TOP 624. Similarly, the match indication signal (bottom), MATCH_AMP_BOT 644, can also be driven high by the corresponding amplifier circuit for the bottom (not shown). However, since discharge control device 610 is off during this time, because the buffered precharge mode indicator signal PRCHM_ 678 is low, there is no discharge path from pVSS 608 to ground enabled.

During the "EVAL" (evaluation) mode, the precharge mode indicator signal PRCH_ 668 is high and can discharge node 676 and turn off precharge sharing devices 646 and 648 because the low level can be passed through precharge level limiter device 618. For a search "hit" case, any of the entry match indication signals, MATCH_AMP_TOP 624 and MATCH_AMP_BOT 644, can remain in the high state they were in during the precharge mode discussed above. For a search "miss" on the top entry, but a search "hit" on the bottom entry, the MATCH_AMP_TOP signal 624 could be low, but the MATCH_AMP_BOT signal 644 could be high. In this case, match indication feedback device (top) 640 can be off, but match indication feedback device (bottom) 642 can be on. Thus, the pVSS line 608 can fully discharge in this case. The similar situation can exist for a search "hit" on the top entry and a search "miss" on the bottom entry. In the fifth embodiment 600, only if both the top and the bottom entries have the search "miss" detection, resulting in both MATCH_AMP_TOP 624 and MATCH_AMP_BOT 644 going low, can the discharge of the pVSS line 608 be discontinued during the evaluation mode. In summary, if either the top or the bottom entry can possibly result in a search "hit", then the pVSS line 608 can continue to discharge. This discharge may then be discontinued during an evaluation mode when it is determined that both associated entries have resulted in search "miss" cases.

As described, a fifth embodiment 600 can allow for power reduction by discontinuing further discharge of the pVSS node 608 and, subsequently, the match line (top) 604 and the match line (bottom) 654, once a search "miss" has been detected by amplifier circuits for a top and bottom entry. Thus, less charge may need to be re-supplied to the pVSS node 608 and to the match line (top) 604 and to the match line (bottom) 654 during the subsequent precharge cycle. This may translate into overall power savings. Additionally, the pseudo-VSS precharge circuit 650 can precharge the pseudo-VSS (PVSS) line 608 to an approximate value of VDD-2Vtn. Finally, the pseudo-VSS line 608 can be shared between adjacent entries for layout area reduction and power saving advantages.

It is noted that an applied comparand value can be an "entire" comparand value, or a portion of a comparand value.

It is also noted that the NMOS devices shown in any of the embodiments could be replaced by other devices with similar functions, such as bi-polar junction transistors (BJTs) or other switch implementations.

It is understood that a match indication can include an exact match between all bits of a comparand value and those of a data value, or a "masked" match between the bits of a comparand value and a masked data value.

Thus, while the preferred embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A content addressable memory (CAM), comprising:
   at least one match line; and
   a plurality of connection devices having a controllable impedance paths, and coupled between the at least one match line and a common node; and
   a discharge control device coupled between the common node and a first supply potential.

2. The CAM of claim 1 wherein:
   each connection device controllable impedance path is controlled by a match indication signal from a CAM cell.

3. The CAM of claim 2 wherein:
   each connection device includes an NMOS transistor.

4. A content addressable memory (CAM), comprising:
   at least one match line;
   series-coupled mask devices and connection devices having a controllable impedance paths, and coupled between the at least one match line and a common node;
   a discharge control device having a controllable impedance path and coupled between the common node and a first supply potential;
   a precharge control device having a controllable impedance path and coupled between a second supply potential and a first node; and
   a precharge limiting device having a controllable impedance path and coupled between the first node and the at least one match line.

5. The CAM of claim 4 wherein:
   the precharge control device is of a first conductivity type; and
   the discharge control device is of a second conductivity type.

6. The CAM of claim 4 wherein:
   each connection device controllable impedance path is controlled by a match indication signal from a CAM cell.

7. The CAM of claim 4 wherein:
   each mask device controllable impedance path is controlled by a mask signal from the mask cell portion of a ternary CAM cell.

8. The CAM of claim 4 wherein:
   the precharge control device is activated by a precharge control signal.

9. The CAM of claim 4 wherein:
   the precharge limiting device includes an n-channel insulated gate field effect transistor with its gate coupled to the second supply potential.

10. A content addressable memory (CAM), comprising:
    at least one match line;
    series-coupled mask devices and connection devices having controllable impedance paths, and coupled between the at least one match line and a common node;
    a discharge limiting device having a controllable impedance path and coupled between the common node and a second node;
    a discharge control device having a controllable impedance path and coupled between the second node and a first supply potential;
    a precharge control device having a controllable impedance path and coupled between a second supply potential and a first node;
    a precharge limiting device having a controllable impedance path and coupled between the first node and the at least one match line; and
    an amplifier circuit coupled to receive the first node as an input and having an amplifier output.

11. The CAM of claim 10 wherein:
    the precharge control device is of a first conductivity type;
    the discharge control device is of a second conductivity type; and
    the discharge limiting device is of the second conductivity type.

12. The CAM of claim 10 wherein:
    each connection device controllable impedance path is controlled by a match indication signal from a CAM cell.

13. The CAM of claim 10 wherein:
    each mask device controllable impedance path is controlled by a mask signal from the mask cell portion of a ternary CAM cell.

14. The CAM of claim 10 wherein:
    the precharge control device is activated by a precharge control signal.

15. The CAM of claim 10 wherein:
    the precharge limiting device includes an n-channel insulated gate field effect transistor with its gate coupled to the second supply potential.

16. A content addressable memory (CAM), comprising:
    at least one match line;
    series-coupled mask devices and connection devices having controllable impedance paths, and coupled between the at least one match line and a common node;
    an amplifier circuit coupled to receive the at least one match line as an input and having an amplifier output;
    at least one discharge limiting device having a controllable impedance path, and coupled between the common node and a first supply potential;
    a logic gate device coupled to receive the amplifier output as a first input and a mode control signal as a second input; and an output of the logic gate device coupled to control the impedance path of the discharge limiting device.

17. The CAM of claim 16 wherein:

the logic gate device includes a NOR gate.

18. The CAM of claim 16 wherein:

each connection device controllable impedance path is controlled by a match indication signal from a CAM cell.

19. The CAM of claim 16 wherein:

each mask device controllable impedance path is controlled by a mask signal from the mask cell portion of a ternary CAM cell.

20. The CAM of claim 16 wherein:

the inverting amplifier circuit further includes match line precharge circuitry.

21. A content addressable memory (CAM), comprising:

at least one first match line;

at least one second match line;

a plurality of first connection devices having controllable impedance paths coupled between the at least one first match line and a common node;

a plurality of second connection devices having controllable impedance paths coupled between the at least one second match line and the common node;

at least one first discharge limiting device having a controllable impedance path and coupled between the common node and a first node;

at least one second discharge limiting device having a controllable impedance path and coupled between the common node and the first node; and at least one discharge control device having a controllable impedance path and coupled between the first node and a first supply potential.

22. The CAM of claim 21, further including:

a plurality of first mask devices having controllable impedance paths arranged in series with the first connection devices between the at least first match line and the common node; and a plurality of second mask devices having controllable impedance paths and in series with the second connection devices between the at least second match line and the common node.

23. The CAM of claim 21, further including:

at least one precharge control device having a controllable impedance path, and coupled between a second supply potential and the at least first match line.

24. The CAM of claim 23, further including:

at least one precharge limiting device having a controllable impedance path that couples the at least first match line to the at least one precharge control device.

25. The CAM of claim 21, further including:

at least one feedback circuit coupled to the at least first match line at an input, and having an output coupled to the at least one first discharge limiting device.

26. The CAM of claim 21, further including:

at least one common node precharge circuit that couples the common node to the at least one first match line and at least one second match line in response to a precharge signal.

27. The CAM of claim 21 wherein:

the at least one precharge control device is of a first conductivity type; and the at least one discharge control device is of a second conductivity type.

28. The CAM of claim 21 wherein:

each connection device controllable impedance path is controlled by a match indication signal from a CAM cell.

29. The CAM of claim 22 wherein:

each mask device controllable impedance path is controlled by a mask signal from the mask cell portion of a ternary CAM cell.

30. The CAM of claim 24 wherein:

the at least one precharge limiting device includes a transistors having a control terminal coupled to a supply potential.

* * * * *